United States Patent [19]
Yeung et al.

[11] Patent Number: 5,963,486
[45] Date of Patent: Oct. 5, 1999

[54] BIT SWITCH CIRCUIT AND BIT LINE SELECTION METHOD

[75] Inventors: Gus Wai-Yen Yeung, Austin; Robert Anthony Ross, Jr., Cedar Park; George McNeil Lattimore, Austin, all of Tex.

[73] Assignee: International Business Machines Corporation, Armonk, N.Y.

[21] Appl. No.: 09/100,354

[22] Filed: Jun. 19, 1998

[51] Int. Cl.[6] .................................................. G11C 7/00
[52] U.S. Cl. .......................................... 365/190; 365/205
[58] Field of Search ..................................... 365/190, 203, 365/205, 207, 208, 51, 63

[56] References Cited

U.S. PATENT DOCUMENTS

| | | | |
|---|---|---|---|
| 4,888,732 | 12/1989 | Inoue et al. | 365/51 |
| 4,922,460 | 5/1990 | Furutani et al. | 365/207 |
| 5,570,319 | 10/1996 | Santoro et al. | 365/190 |
| 5,748,547 | 5/1998 | Shau | 365/63 |

OTHER PUBLICATIONS

Richard Guo, Terry Y. Su and Chia Chi Chao, "A 500 Mhz 1Mb On–Chip Cache Design Using Multi–Level Bit Line Sensing Scheme", 1996 Symposium on VLSI Circuits, Digest of Technical Papers, pp. 130–131.

*Primary Examiner*—Son Mai
*Attorney, Agent, or Firm*—Anthony V. S. England; Russell D. Culbertson

[57] ABSTRACT

A bit switch circuit (10) includes an amplifier stage (11) and a plurality of input stages (23,33,43,53). Each input stage (23,33,43,53) is connected to receive as inputs the signals applied to a bit line pair associated with a memory array. Each input stage (23,33,43,53) is also associated with a common node (24,34,44,54), and a select transistor (T4, T5, T6, T7). Each select transistor (T4, T5, T6, T7) responds to a select input signal to couple the respective common node (24,34,44,54) to ground. This allows the sense amplifier (11) to respond to the data signals on the bit line pair (20,21,30, 31,40,41,50,51) associated with the respective input stage (23,33,43,53).

17 Claims, 2 Drawing Sheets

BIT SWITCH CIRCUIT AND BIT LINE SELECTION METHOD

TECHNICAL FIELD OF THE INVENTION

The invention relates to computer memory arrays and, more particularly, to an apparatus for selecting a desired bit line pair from a plurality of bit line pairs during a read operation from a memory array. The invention also encompasses a method for selecting from a plurality of bit line pairs during a read operation from a memory array.

BACKGROUND OF THE INVENTION

Memory devices for digital computers are made up of many individual memory cells arranged in an array. Each memory cell is adapted to store one bit of information. In the memory cell array, groups of individual memory cells are arranged in columns with the individual cells in each column connected together by two conductors referred to as bit lines. A memory array may include many columns of memory cells, each column including a bit line pair. Also, each memory cell in the array is connected to a conductor referred to as a word line. The memory array includes a number of word lines, each word line commonly connecting memory cells in a row across the different columns. The word lines are used to activate an individual cell in a particular column for a read operation from the cell or a write operation to the cell.

The bit lines associated with a particular memory cell in a memory array are used to write a bit of information to the memory cell. In a write operation, the particular cell in the column is selected using the word line associated with the cell and then a desired charge state representing a bit of information is applied to the bit line pair associated with the selected cell. The charge state comprises a "high" level voltage signal on one bit line and a "low" level voltage signal on the other bit line of the pair. A "high" level voltage signal on one bit line of the pair represents a "1" while the "high" level voltage on the other bit line represents a "0". The memory cell stores the desired bit of data by maintaining a "high" charge state at one node in the memory cell and a "low" charge state at another node in the cell.

A bit of information stored in a memory cell is read from the cell using the bit line pair connected to the cell, a column decoder, and a sense amplifier. The column decoder is connected to each bit line pair in the memory array and operates to select the bit line pair associated with the memory cell from which data is to be read. Before a read operation, the bit lines associated with the desired cell are both pre-charged to a "high" voltage level. In the read operation, the desired memory cell is activated using the word line associated with the cell, and this activation enables the cell to apply the stored charge state to the bit lines associated with the cell. When the charge state stored by the cell is applied to the bit lines, the voltage on one bit line remains at the "high" level voltage while the voltage on the other bit line drifts to a lower voltage level. When a sufficient voltage differential develops between the bit lines, the sense amplifier converts signals on the selected bit lines to digital signals representing the data which was stored by the memory cell.

In order to improve system performance it is desirable to increase the speed at which data may be written to a memory cell and increase the speed at which data may be read from the cell. One factor in the rate at which data may be read from a memory cell is the time required for the minimum voltage differential to develop on the bit lines during a read operation. In order to enhance the speed of a read operation, columns of memory cells may be divided up into segments. Each segment of memory cells may be connected to a local bit line pair. This local bit line pair is connected to a global bit line pair through a suitable boost amplifier. A boost amplifier arrangement is illustrated in U.S. patent application Ser. No. 08/904,987, entitled Bit Line Domino Boost Amplifier, the disclosure of which is hereby incorporated herein by reference.

Another factor in the speed of a read operation is the speed at which a particular bit line pair may be selected by the column decoder. In prior art memory arrays the column decoder arrangement included a plurality of bit switch transistors, each transistor connecting a different bit line to the input of the sense amplifier. The bit switch transistors were used as switches to enable only the desired bit lines to provide an input to the sense amplifier in a particular read operation. In a read operation, biasing signals were applied to the bit switches associated with the two bit lines from which the data was to be read. These biasing signals biased the particular bit switches to a conductive state allowing the charge state of the two bit lines to be applied as the inputs to the sense amplifier. The sense amplifier then operated in response to a sense enable signal to sense the differential voltage state on its inputs and produce the desired digital signal output.

This prior art bit switch arrangement required the memory cell in a read operation not only to drive the voltage on the bit line pair but also drive the voltage signals on the input lines to the sense amplifier. The diffusion capacitance on the bit lines and the inputs to the sense amplifier slowed the rate at which the required differential voltage developed at the sense amplifier inputs and therefore slowed the read operation.

SUMMARY OF THE INVENTION

It is an object of the invention to overcome the above-described problems and others associated with selecting a desired bit line pair in a read operation from a memory array. More particularly, it is an object of the invention to provide a bit switch circuit which improves the speed at which a particular bit line pair may be selected. It is also an object of the invention to provide a method for more rapidly selecting a bit line pair from a plurality of bit line pairs in a memory array.

These objects are accomplished in a circuit which integrates the operation of a sense amplifier with the bit switch circuit. The bit switch circuit according to the invention includes a sense amplifier having a plurality of input stages. A different input stage is associated with each bit line pair. Each input stage also has associated with it a select transistor. Each select transistor operates in response to a select signal to enable the particular input stage, allowing the signals from the respective bit lines to be sensed by the sense amplifier.

Each input stage includes a first input transistor, a second input transistor, and a common node. The gate of each first input transistor is connected to one bit line of a particular bit line pair and the gate of each second input transistor is connected to the other bit line of the bit line pair. The source-drain conduction path of the first input transistor connects a first output node of the sense amplifier to the common node associated with the respective input stage. The source-drain conduction path of each second input transistor couples a second output node of the sense amplifier to the respective common node. The select transistor associated with each respective input stage has a source-drain conduction path connecting the respective common node to ground.

According to the invention, a particular bit line pair of the memory array is selected in a read operation through the select transistor associated with the particular input stage to which the desired bit lines are connected. The select signal at the gate of the select transistor biases the select transistor to couple the respective common node to ground. When the common node of an input stage is connected to ground, the sense amplifier circuit senses the voltage signals appearing on the bit lines connected to the respective input stage and produces output signals at the sense amplifier output nodes. These output signals are representative of the data applied to the bit lines by the particular memory cell in the read operation.

By applying the bit line signals to the gates of the input transistors, and by selecting a desired bit line pair with the select transistor, the bit lines are isolated from the capacitance of the sense amplifier output nodes. Furthermore, the long input lines associated with traditional bit switch circuits are eliminated entirely. Isolating the bit lines in this fashion and eliminating the long bit switch input lines facilitates faster development of the desired differential voltage in a read operation. Also, the bit switch circuit of the invention may be used as a first sense amplifier stage with the output applied to a second bit switch arrangement either having a traditional design or the current design.

These and other objects, advantages, and features of the invention will be apparent from the following description of the preferred embodiments, considered along with the accompanying drawings.

DESCRIPTION OF THE PREFERRED EMBODIMENTS

Figure 1:
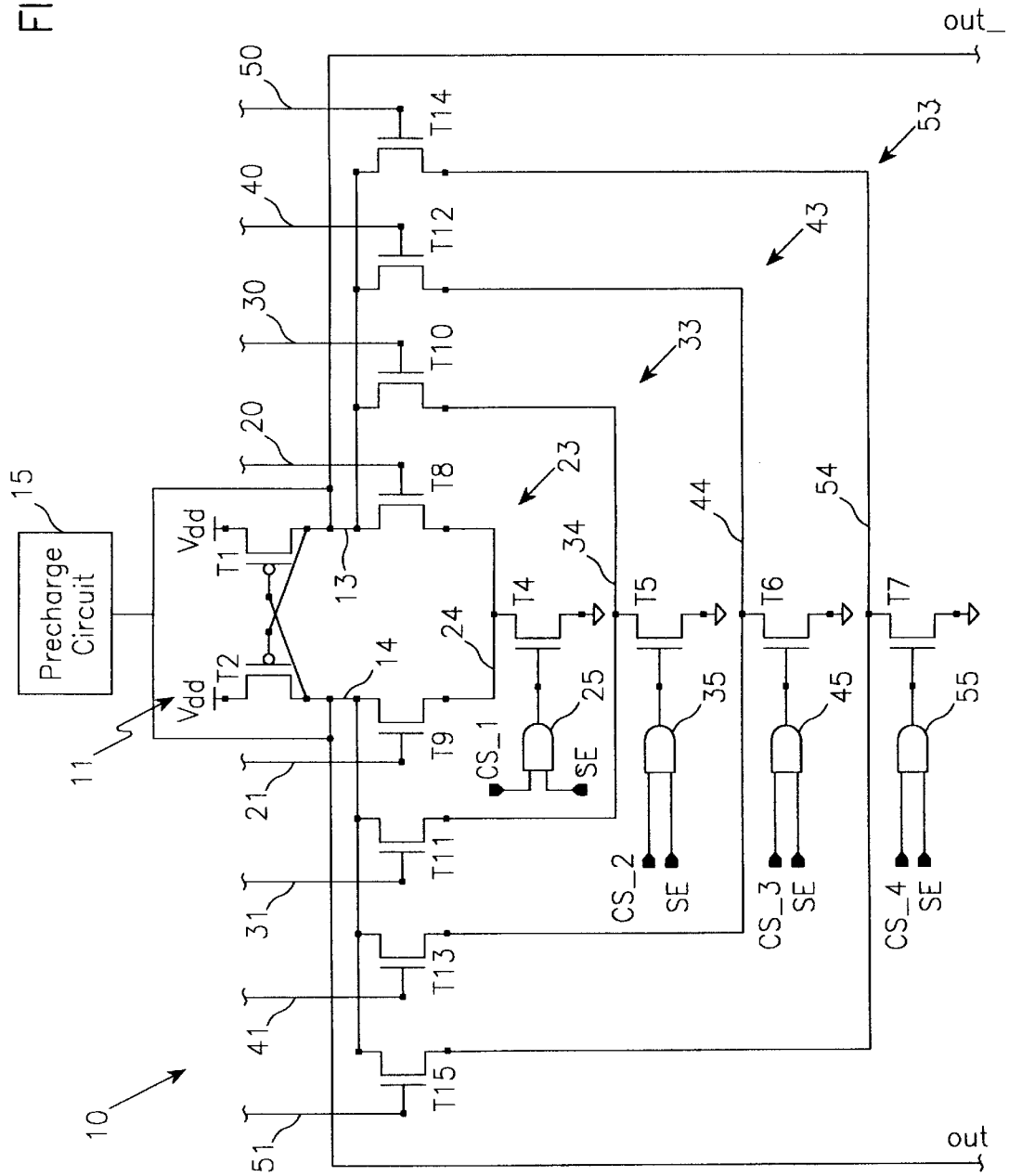
FIG. 1 is an electrical schematic diagram illustrating a bit switch circuit embodying the principles of the invention.

FIG. 1 illustrates a bit switch circuit 10 embodying one preferred form of the invention. The illustrated bit switch circuit 10 is adapted to select between a plurality of bit line pairs, one bit line pair comprising bit lines 20 and 21, another comprising bit lines 30 and 31, another comprising bit lines 40 and 41, and finally another comprising bit lines 50 and 51. Each bit line pair is connected to a column of memory cells in a digital memory array (not shown), either directly or through a boost amplifier (also not shown). Although FIG. 1 shows four different bit line pairs for purposes of illustrating the invention, those skilled in the art will readily appreciate that the invention may be implemented with more or fewer bit line pairs and may commonly be implemented with on the order of four to eight bit line pairs.

The bit switch circuit 10 according to the invention comprises a sense amplifier 11 having a plurality of input stages shown generally at reference numerals 23, 33, 43, and 53. Each input stage is connected to a first output node 13 and a second output node 14. A first amplifier transistor T1 comprises a P-type field effect transistor ("FET") having its drain-source conduction path connecting the first output node 13 to a supply voltage $V_{dd}$. The gate of first amplifier transistor T1 is connected to the second output node 14. A second amplifier transistor T2 comprises a P-type FET having its drain-source conduction path connecting the second output node 14 to the supply voltage $V_{dd}$. The gate of second amplifier transistor T2 is connected to the first output node 13. Both the first and second output nodes 13 and 14, respectively, are preferably pre-charged to the supply voltage level $V_{dd}$ through a pre-charge circuit 15 prior to each read operation. Pre-charge circuit 15 may comprise any suitable arrangement for providing the desired pre-charge to the output nodes 13 and 14.

Each input stage is associated with a different bit line pair. As shown in FIG. 1, bit lines 20 and 21 are associated with input stage 23, bit lines 30 and 31 are associated with input stage 33, bit lines 40 and 41 are associated with input stage 43, and bit lines 50 and 51 are associated with input stage 53. Each input stage also includes a common node. Input stage 23 is associated with common node 24, input stage 33 is associated with common node 34, input stage 43 is associated with common node 44, and input stage 53 is associated with common node 54. Each input stage is also associated with a select transistor. Input stages 23, 33, 43, and 53 are associated with select transistors T4, T5, T6, and T7, respectively, each comprising an N-type FET. The gate of select transistor T4 is connected to select AND gate 25, while select transistors T5, T6, and T7 are similarly connected to select AND gates 35, 45, and 55, respectively. Finally, each input stage includes a first and second input transistor, each an N-type FET. Input stage 23 includes first input transistor T8 and second input transistor T9, input stage 33 includes first input transistor T10 and second input transistor T11, input stage 43 includes first input transistor T12 and second input transistor T13, and input stage 53 includes first input transistor T14 and second input transistor T15.

Referring particularly to input stage 23, the source-drain conduction path of first input transistor T8 connects the first output node 13 to the respective common node 24. Second input transistor T9 has its source-drain conduction path connecting the second output node 14 to common node 24. Select transistor T4 has its source-drain conduction path connecting common node 24 to ground. The gate of select transistor T4 is connected to receive a select input signal from select AND gate 25. Select AND gate 25 receives a column select signal CS_1 at a first input and a sense enable signal SE at a second input.

The respective first input, second input, and select transistors of the other input stages 33, 43, and 53 are connected similarly to those of input stage 23. However, each select AND gate 25, 35, 45, and 55 receives a unique column select signal, CS_1, CS_2, CS_3, and CS_4, respectively.

The operation of bit switch circuit 10 shown in FIG. 1 will now be described in connection with the process of selecting data signals on bit lines 20 and 21. Prior to a read operation using the bit switch 10 shown in FIG. 1, pre-charge circuit 15 pre-charges both the first output node 13 and the second output node 14 substantially to the supply voltage level $V_{dd}$. At this point the supply voltage level signal at first output node 13 biases second amplifier transistor T2 to a non-conductive state while the supply voltage level signal at second output node 14 biases first amplifier transistor T1 to a non-conductive state.

When data appears on bit lines 20 and 21, depending on the data, one bit line will maintain a "high" level voltage signal while the voltage level on the other bit line will decay. For purposes of description, assume that the data being read produces a "high" level voltage signal on bit line 20 and the lower voltage level signal on bit line 21. The higher voltage state at the gate of first input transistor T8 makes the first input transistor relatively more conductive than the second input transistor T9. However, the current through first input transistor T8 and second input transistor T9 is controlled by select transistor T4. With select transistor T4 biased to a non-conductive state, neither the first output node 13 nor second output node 14 may discharge and therefore remain substantially at the pre-charge voltage level $V_{dd}$. Each other input stage operates similarly. Thus, as long as the respective select transistor of each input stage remains in a non-conductive state, the signals at the gates of the first input transistor and second input transistor of the respective input stage have no effect on the charge state at the first and second output nodes 13 and 14, respectively.

Referring again to the example of input stage 23, when data is present on bit lines 20 and 21 and a select signal is applied to the gate of select transistor T4, the select transistor becomes conductive and allows the voltage at the output nodes to discharge through the respective input transistor T8 or T9, and select transistor T4. In the example of data comprising a "high" level voltage signal on bit line 20 and a "low" level voltage signal on bit line 21, the voltage at first output node 13 falls more quickly due to the more conductive first input transistor T8. This lower voltage signal at first output node 13 is applied to the gate of second amplifier transistor T2, biasing the second amplifier transistor to conduct and thereby help maintain the high voltage level signal at the second output node 14. The higher voltage signal at the second output node 14 is applied to the gate of first amplifier transistor T1 to keep first output node 13 isolated from the supply voltage $V_{dd}$.

In the circuit illustrated in FIG. 1, the output signal appearing at second output node 14 corresponds to the input applied at the gate of the respective first input transistor T8, T10, T12, and T14. The signal at first output node 13 corresponds to the signal applied to the gate of the respective second input transistor T9, T11, T13 and T15. Those skilled in the art will readily appreciate that the signals at the output nodes 13 and 14 may each be inverted through a suitable inverter circuit to switch the signals at the first and second output nodes. The signals at the output nodes may also be buffered and/or inverted to produce better digital signals.

The select input signal is derived from the column select signal to the respective input stage and the sense enable signal SE. The column select signal is applied as a first input to the respective select AND gate 25, 35, 45, or 55. The sense enable signal SE is applied as the second input to the respective select AND gate. Each select AND gate simultaneously receives the sense enable signal SE, but only one select AND gate at a time receives the respective column select signal CS_1, CS_2, CS_3, or CS_4. Thus, the column select signal operates to control which bit lines are selected in a read operation, similarly to a standard bit switch configuration. A select signal is produced from one of the select AND gates 25, 35, 45, or 55 only if a "high" column select signal CS_1, CS_2, CS_3, or CS_4 is applied to the respective AND gate concurrently with the sense enable signal SE. Otherwise, the output of the respective select AND gate remains "low", and the corresponding select transistor remains in a non-conductive state.

Figure 2:
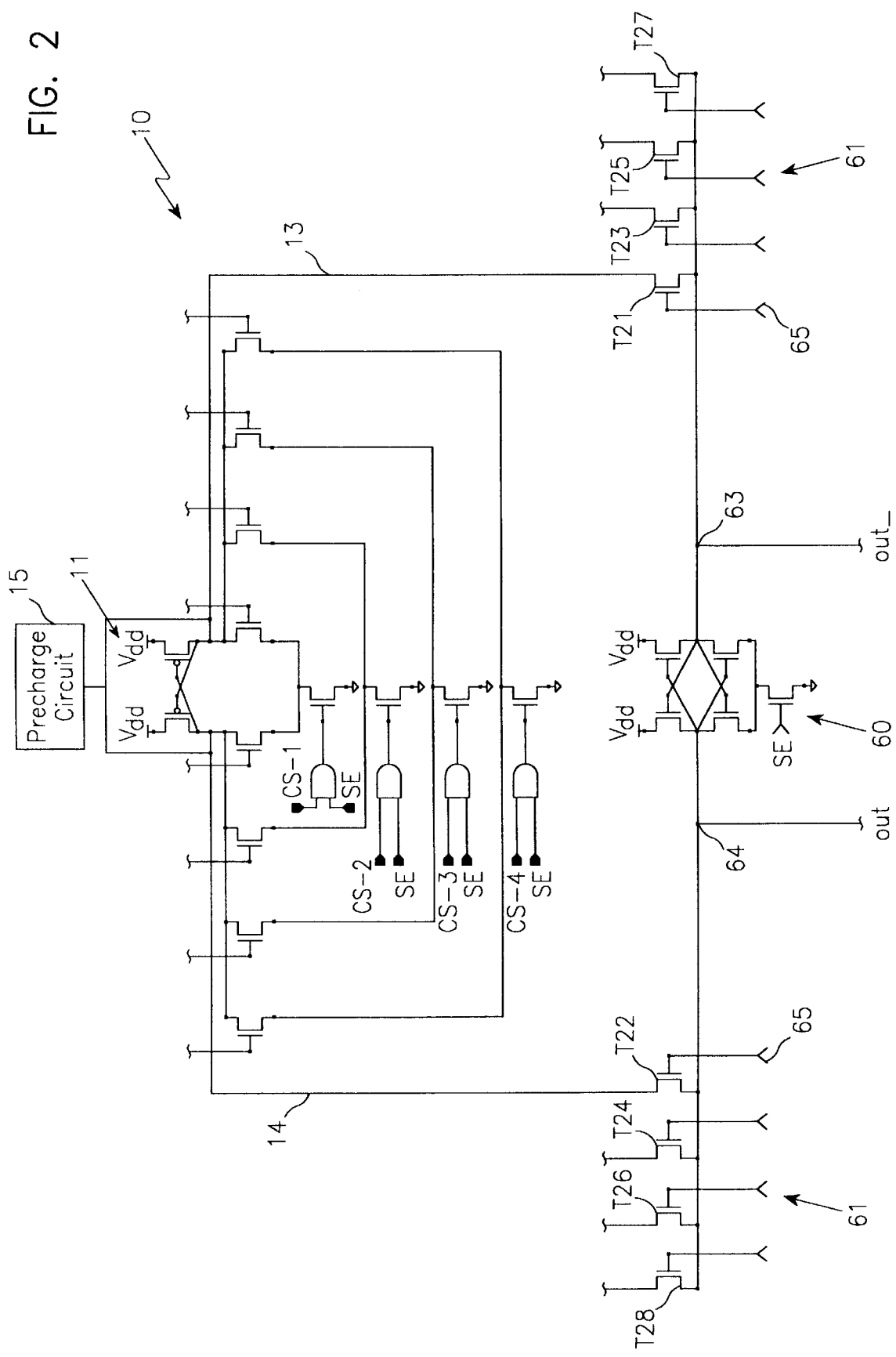
FIG. 2 is an electrical schematic diagram illustrating the bit switch circuit of FIG. 1 used as a first stage in a multi-stage sense amplifier arrangement.

FIG. 2 illustrates the bit switch circuit 10 implemented as a first stage in a two-stage sense amplifier. The bit switch circuit 10 shown in FIG. 2 is identical to the bit switch circuit shown in FIG. 1. However, the output signals from bit switch circuit 10 in FIG. 2 are applied to a second sense amplifier 60 through a traditional bit switch arrangement 61.

The second stage sense amplifier 60 includes a first input/output node 63 and a second input/output node 64. The signal at first output node 13 from bit switch circuit 10 is applied to first input/output node 63 of the second stage sense amplifier 60 through switching transistor T21. The signal at second output node 14 from bit switch circuit 10 is applied to second input/output node 64 of the second stage sense amplifier 60 through switching transistor T22. Each of these switching transistors T21 and T22 form part of the bit switch arrangement 61 and comprises an N-type FET having its gate connected to an activation input 65 through which an activation signal may be applied. The activation signal biases both switching transistors T21 and T22 to conduct and thereby couple the output signals of the bit switch circuit 10 to the input/output nodes 63 and 64 of the second stage sense amplifier 60.

Bit switch arrangement 61 includes additional pairs of switching transistors T23/T24, T25/T26, and T27/T28. Each of the switching transistors T23, T25, and T27 has its source-drain conduction path connected between first input/output node 63 of the second stage sense amplifier 60 and the first output node of another bit switch circuit (not shown) similar to bit switch circuit 10. Each of the switching transistors T24, T26, and T28 has its source-drain conduction path connected between second input/output node 64 of the second stage sense amplifier 60 and the second output node of another bit switch circuit (not shown) similar to bit switch circuit 10. The pairs of switching transistors T21/T22, T23/T24, T25/T26, and T27/T28 are used to select an output from a particular bit switch circuit such as circuit 10 for application as the input to the second stage sense amplifier 60. Thus, the arrangement shown in FIG. 2 provides two levels of multiplexing. One level of multiplexing is at the bit switch circuits, such as the illustrated circuit 10, used for selecting between a plurality of bit line pairs. The second level of multiplexing is at the second stage sense amplifier 60 and bit switch arrangement 61 in selecting between the outputs of the various bit switch circuits.

The above described preferred embodiments are intended to illustrate the principles of the invention, but not to limit the scope of the invention. Various other embodiments and modifications to these preferred embodiments may be made by those skilled in the art without departing from the scope of the following claims. For example, many different types of transistors and transistor arrangements may be used in a bit switch circuit embodying the principles of the invention. Another example of variations within the scope of the invention relates to the sense amplifier portion of the bit switch circuit 10. Any suitable sense amplifier arrangement may be used as the sense amplifier portion 11.

We claim:

1. A bit switch circuit for selecting one of a plurality of bit line pairs in a read operation from a digital memory array, the bit switch circuit comprising;
    (a) an amplifier stage having a first output node and a second output node;
    (b) a plurality of input stages, each input stage having a different common node associated therewith, each input stage also being connected to the bit lines of a different bit line pair and connecting the respective common node to the first output node and the second output node; and
    (c) a plurality of select transistors, each select transistor being associated with a different input stage and operating to couple the common node of the respective input stage to ground in response to a select signal at the respective select transistor.

2. The bit switch circuit of claim 1 wherein each input stage further comprises:
    (a) a first input transistor having a drain-source conduction path connecting the first output node to the respective common node; and
    (b) a second input transistor having a drain-source conduction path connecting the second output node to the respective common node.
3. The bit switch circuit of claim 2 wherein:
    (a) the first input transistor of each input stage has a gate connected to a first bit line of the respective bit line pair; and
    (b) the second input transistor of each input stage has a gate connected to a second bit line of the respective bit line pair.
4. The bit switch circuit of claim 2 wherein the amplifier stage comprises:
    (a) a first amplifier transistor having a source-drain conduction path connecting the first output node to a supply voltage source and a gate connected to the second output node; and
    (b) a second amplifier transistor having a source-drain conduction path connecting the second output node to the supply voltage source and a gate connected to the first output node.
5. The bit switch circuit of claim 1 further comprising:
    (a) a precharge circuit connected to the first output node and the second output node for precharging the first output node and second output node prior to a read operation.
6. The bit switch circuit of claim 1 wherein:
    (a) the first output node is connected to a first input of a second amplifier; and
    (b) the second output node is connected to a second input of the second amplifier.
7. The bit switch circuit of claim 1:
    (a) wherein each select transistor has a drain-source conduction path connecting the respective common node to ground and has a gate connected to a select input on which the select signal is applied.
8. The bit switch circuit of claim 7 further comprising for each select transistor:
    (a) a different select AND gate having an output connected to the select input of the respective select transistor and adapted to receive a column select signal at a first input and a sense enable signal at a second input.
9. A bit switch circuit for selecting one of a plurality of bit line pairs in a read operation from a digital memory array, the circuit comprising:
    (a) a first output node and a second output node;
    (b) a plurality of input stages, each respective input stage associated with a different bit line pair of the plurality of bit line pairs, and each input stage having a first input transistor, a second input transistor, and a common node, the first input transistor having a drain-source conduction path connecting the first output node and the respective common node and having a gate connected to a first bit line of the respective bit line pair, the second input transistor having a drain-source conduction path connecting the second output node and the respective common node and having a gate connected to a second bit line of the respective bit line pair;
    (c) a plurality of select transistors, each select transistor associated with a different input stage and having a drain-source conduction path connecting the respective common node to ground, each select transistor also having a gate connected to receive a select input signal which is unique to the particular select transistor;
    (d) a first amplifier transistor having a source-drain conduction path connecting the first output node to a supply voltage and having a gate connected to the second output node; and
    (e) a second amplifier transistor having a source-drain conduction path connecting the second output node to the supply voltage and having a gate connected to the first output node.
10. The bit switch circuit of claim 9 wherein:
    (a) the first output node is connected through a source-drain conduction path of a first bit switch transistor to a first input of a second amplifier; and
    (b) the second output node is connected through a source-drain conduction path of a second bit switch transistor to a second input of the second amplifier.
11. The bit switch circuit of claim 9 wherein:
    (a) the first output node is connected to a first input of a second amplifier; and
    (b) the second output node is connected to a second input of the second amplifier.
12. The bit switch circuit of claim 9 further comprising for each select transistor:
    (a) a different select AND gate having an output connected to the gate of the respective select transistor and having a first input connected to receive a column select signal and a second input connected to receive a sense enable signal.
13. A method of selecting from a plurality of bit line pairs during a read operation from a digital memory array, the method comprising the steps of:
    (a) applying the signals from each bit line pair to a different alternate input stage of a sense amplifier, each alternate input stage having a different select transistor associated therewith; and
    (b) applying a select input signal to the select transistor associated with a desired one of the alternate input stages.
14. The method of claim 13 wherein each select input signal is produced by the steps of:
    (a) applying a column select signal as a first input to a select AND gate; and
    (b) applying a sense enable signal as a second input to the select AND gate.
15. The method of claim 13 wherein the step of applying the signals from each bit line pair comprises:
    (a) applying a signal from a first bit line of one of the bit line pairs to the gate of a first input transistor associated with the respective input stage; and
    (b) applying a signal from a second bit line of said bit line pair to a gate of a second input transistor associated with said respective input stage.
16. The method of claim 13 further comprising the step of:
    (a) applying the signals at the first and second output nodes to first and second inputs of a second amplifier.
17. The method of claim 16 further comprising the steps of:
    (a) controlling the first input of the second amplifier with a first bit switch transistor; and
    (b) controlling the second input of the second amplifier with a second bit switch transistor.

* * * * *